United States Patent [19]

Suwa et al.

[11] Patent Number: 5,157,630
[45] Date of Patent: Oct. 20, 1992

[54] SEMICONDUCTOR MEMORY WHICH CAN BE PREVENTED FROM SHIFTING TO UNDESIRED OPERATION MODE

[75] Inventors: Makoto Suwa; Hiroshi Miyamoto, both of Hyogo, Japan

[73] Assignee: Mitsubishi Denki Kabushiki Kaisha, Tokyo, Japan

[21] Appl. No.: 629,727

[22] Filed: Dec. 21, 1990

[30] Foreign Application Priority Data

Dec. 28, 1989 [JP] Japan .................................. 1-340228

[51] Int. Cl.⁵ .............................................. G11C 13/00
[52] U.S. Cl. ..................................... 365/201; 365/200
[58] Field of Search ............................... 365/200, 201

[56] References Cited

U.S. PATENT DOCUMENTS 5,088,063 2/1992 Matsuda et al. ..................... 365/201

FOREIGN PATENT DOCUMENTS

3639169C2 11/1986 Fed. Rep. of Germany .

*Primary Examiner*—Terrell W. Fears
*Attorney, Agent, or Firm*—Lowe, Price, LeBlanc & Becker

[57] ABSTRACT

Disclosed are an $\overline{RAS}$ input circuit (100a) and a $\overline{CAS}$ input circuit (200a) applicable to a dynamic random access memory (DRAM). The threshold voltage $V_{TRAS}$ of the $\overline{RAS}$ input circuit and the threshold voltage $V_{TCAS}$ of the $\overline{CAS}$ input circuit are settled to satisfy the relation $V_{TRAS} > V_{TCAS}$. Therefore, a L level of an external $\overline{RAS}$ signal is more easily determined by a L level of an external $\overline{CAS}$ signal. As a result, the DRAM is prevented from erroneously starting its operation under a test mode without an external request.

7 Claims, 8 Drawing Sheets

$$\frac{W_{12}}{W_{11}} < \frac{W_{22}}{W_{21}}$$

POLYSILICON WIRING

ALUMINUM WIRING

SEMICONDUCTOR MEMORY WHICH CAN BE PREVENTED FROM SHIFTING TO UNDESIRED OPERATION MODE

BACKGROUND OF THE INVENTION

1. Field of the Invention

The present invention relates generally to semiconductor memories, and more particularly, to semiconductor memories operable under operation modes designated by a combination of externally applied two control signals. The present invention has particular applicability to dynamic random access memories (DRAMs).

2. Description of the Background Art

In recent years, semiconductor memories are used in various electric apparatuses such as computers. In particular, the demand for dynamic random access memories (hereinafter referred to as "DRAM") and static random access memories (hereinafter referred to as "SRAM") is expected to increase further in the future. While the present invention is applicable to semiconductor memories (for example DRAMs and SRAMs) operating under operation modes designated by a combination of two externally applied control signals, a description will be made of a DRAM in the following for the purpose of simplicity.

Figure 1:
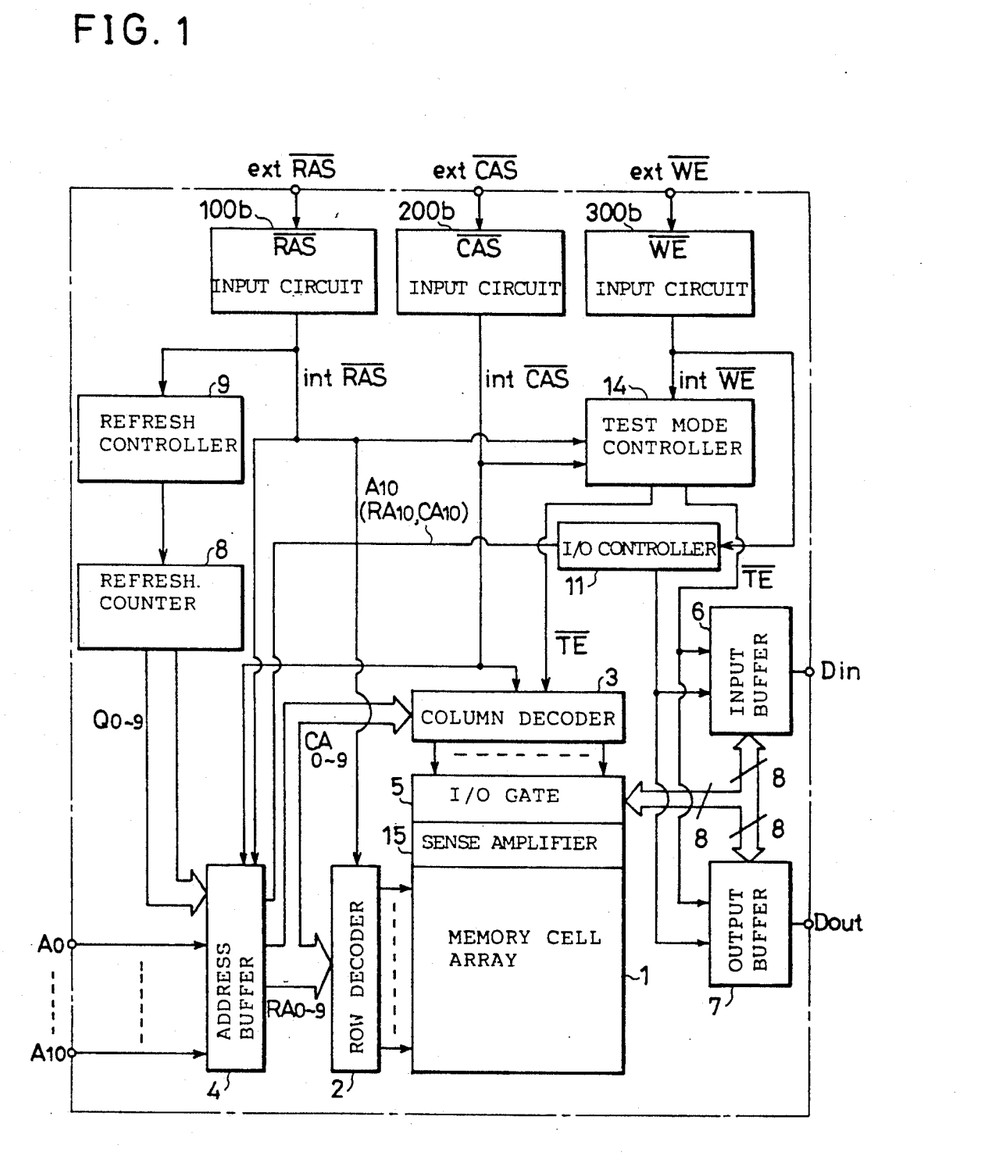
FIG. 1 is a block diagram of a conventional DRAM.

FIG. 1 is a block diagram of a conventional DRAM. With reference to FIG. 1, the DRAM comprises a memory cell array 1 having a plurality of memory cells arranged in rows and columns, an address buffer 4 receiving externally applied external address signals A0 to A10, a row decoder 2 for decoding row address signals RA0 to RA9 output from address buffer 4, a column decoder 3 for decoding column address signals CA0 to CA9 output from address buffer 4 and a sense amplifier 15 for amplifying the signals read from memory cell alley 1. The DRAM further comprises a $\overline{RAS}$ input circuit 100b receiving an external row address strobe signal (referred to as "$\overline{RAS}$ signal" hereinafter), a $\overline{CAS}$ input circuit 200b receiving an external column address strobe signal (referred to as "$\overline{CAS}$ signal" hereinafter) and a $\overline{WE}$ input circuit 300b receiving an external write control signal (referred to as "$\overline{WE}$ signal" hereinafter). $\overline{RAS}$ input circuit 100b generates an intern signal. $\overline{CAS}$ input circuit 200b generates an internal $\overline{CAS}$ signal in response to the external $\overline{CAS}$ signal. $\overline{WE}$ input circuit 300b generates an internal $\overline{WE}$ signal in response to the external $\overline{WE}$ signal.

Row decoder 2 selects a row, that is, a word line designated by row address signals RA0 to RA9 in response to the internal $\overline{RAS}$ signal. Column decoder 3 selects a column designated by column address signals CA0 to CA9 in response to the internal $\overline{CAS}$ signal. In other words, column decoder 3 turns on the transistors connected to the column designated by column address signals CA0 to CA9 in an I/0 gate circuit 5 to connect the bit lines in the designated column with an input buffer 6 or an output buffer 7.

Address buffer 4 receives external address signals A0 to A10 to apply row address signals RA0 to RA9 and column address signals CA0 to CA9 to row decoder 2 and column decoder 3, respectively, in an ordinary writing and reading mode. Address buffer 4 receives internal address signals Q0 to Q9 generated from a refresh counter 8 to apply row address signals RA0 to RA9 for refreshing to row decoder 2 in a refreshing mode. A refresh controller 9 controls refresh counter 8 in response to the internal $\overline{RAS}$ signal. It is pointed out that the operation modes of the DRAM are determined or controlled by the combinations of the internal $\overline{RAS}$ signal, the internal $\overline{CAS}$ signal and the internal $\overline{WE}$ signal.

In the ordinary writing and reading mode, data is transferred between I/0 gate circuit 5 and input buffer 6 or between I/0 gate circuit 5 and output buffer 7 on a 4-bit basis. When the internal $\overline{WE}$ signal is at a H level (a logical high)(in a reading mode), an I/0 controller 11 outputs data Dout read from memory cell array 1 through output buffer 7 in response to a row address signal RA10 and a column address signal CA10. When the internal $\overline{WE}$ signal is at a L level (logical low) (in a writing mode), I/0 controller 11 applies input data Din externally applied through input buffer 6, to I/0 gate circuit 5 on a 4-bit basis.

A test mode controller 14 detects an external designation of a test mode in response to the internal $\overline{RAS}$ signal, the internal $\overline{CAS}$ signal and the internal $\overline{WE}$ signal. That is, test mode controller 14 generates a test signal $\overline{TE}$ of a L level when the test mode is externally designated. Column decoder 3 decodes column address signals CA1 to CA9 when the L level test signal $\overline{TE}$ is applied. That is, column address bit CA0 is disregarded. As a result, the data transfer between I/0 gate 5 and input buffer 6 or output buffer 7 is performed on a 8-bit basis. When the L level test signal $\overline{TE}$ is applied, input buffer 6 and output buffer 7 operate to carry out data reading and writing on a 8-bit basis. In other words, when the test mode is externally designated, the testing operation for a memory cell is automatically started.

Figure 2:
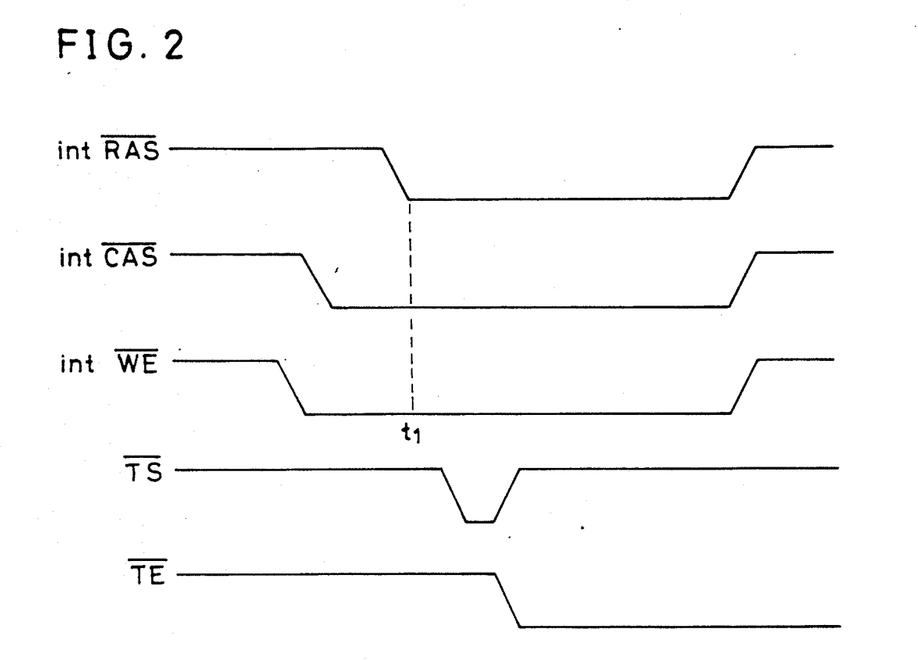
FIG. 2 is a timing chart showing a start of a test mode.
Figure 3:
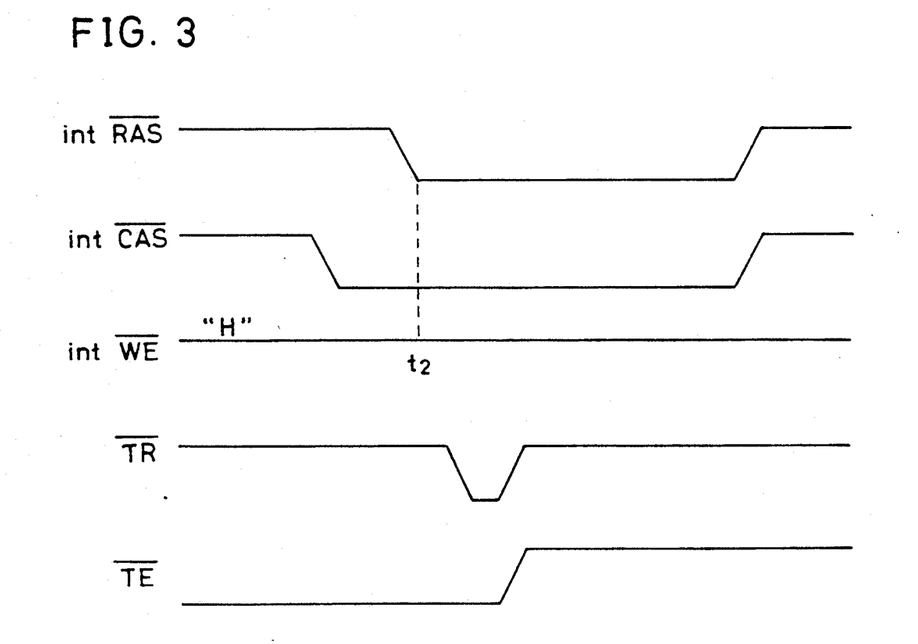
FIG. 3 is a timing chart showing an end of the test mode.

A start and an end of the test mode are designated according to the timing charts shown in FIGS. 2 and 3. With reference to FIG. 2, upon the designation of the start of the test mode, internal $\overline{CAS}$ signal and internal $\overline{WE}$ signal are caused to fall. This is followed by a fall of internal $\overline{RAS}$ signal at the time t1. When internal $\overline{CAS}$ signal and internal $\overline{WE}$ signal are at the L level, test mode controller 14 detects the designation of the start of the test mode in response to the fall of internal $\overline{RAS}$ signal. Consequently, test mode controller 14 generates a test starting pulse $\overline{TS}$ and a low level test signal $\overline{TE}$.

Conversely, upon the designation of the end of the test mode, internal $\overline{CAS}$ signal is first caused to fall as shown in FIG. 3. Internal $\overline{WE}$ signal is held at the H level. When internal $\overline{RAS}$ signal falls (at time t2), test mode controller 14 detects the external designation of the end of the test mode by detecting the L level internal $\overline{CAS}$ signal and the H level internal $\overline{WE}$ signal. Consequently, test mode controller 14 generates a test ending pulse $\overline{TR}$ to raise test signal $\overline{TE}$. It is pointed out that the timings of the signal changes shown in FIG. 3 are the same as those in a $\overline{CAS}$ before $\overline{RAS}$ refresh cycle.

Figure 4:
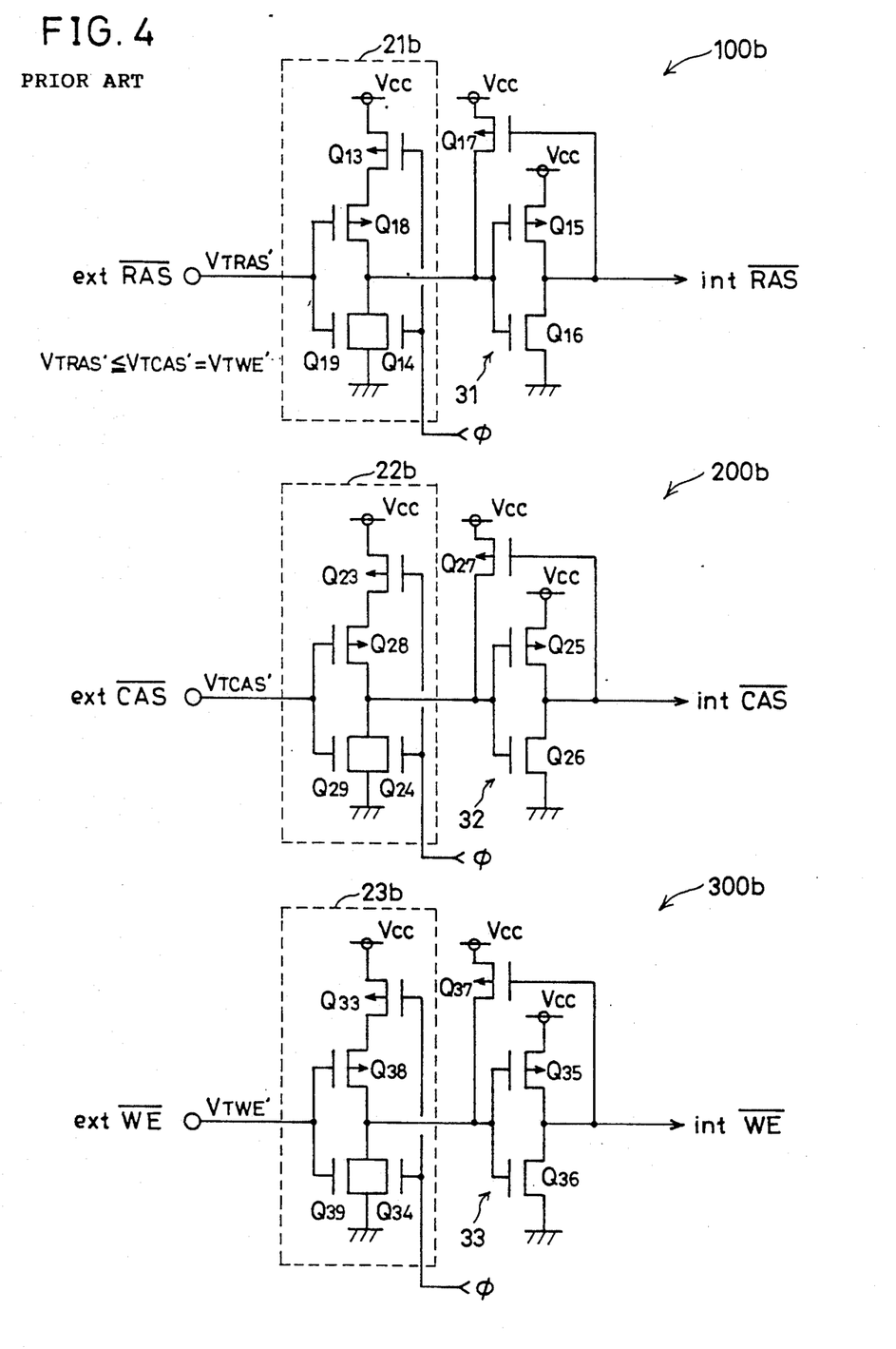
FIG. 4 is a circuit diagram showing the $\overline{RAS}$ input circuit, the $\overline{CAS}$ input circuit and the $\overline{WE}$ input circuit shown in FIG. 1.

FIG. 4 is a circuit diagram showing $\overline{RAS}$ input circuit 100b, $\overline{CAS}$ input circuit 200b and $\overline{WE}$ input circuit 300b shown in FIG. 1. Each of the input circuits 100b, 200b and 300b shown in FIG. 4 has the same circuit arrangement. For example, $\overline{RAS}$ input circuit 100b includes cascaded-inverters 21b and 31. Inverter 21b comprises a PMOS transistors Q13, Q18 and a NMOS transistor Q19 connected in series between a power supply Vcc and ground. An NMOS transistor Q14 is connected in parallel to transistor Q19. Transistors Q18 and Q19 are connected to receive external $\overline{RAS}$ signal at their gates. Transistors Q13 and Q14 are connected to receive an activating signal φ at their gates. Inverter 31 includes a PMOS transistor Q15 and an NMOS transistor Q16 connected in series between power supply Vcc and ground. A PMOS transistor Q17 is connected between power supply Vcc and the input node of inverter 31 to accelerate the charging of the input node. Transistor Q17 has a gate connected to the output node of inverter 31.

Inverter 21b has a threshold voltage $V_{TRAS}'$. The threshold voltage value is determined according to a ratio of transistor size such as a channel width ratio of transistor Q18 to transistor Q19. Similarly, an inverter 22b has a threshold voltage $V_{TCAS}'$ and an inverter 23b has a threshold voltage $V_{TWE}'$. It is pointed out that the threshold voltage values of inverters 21b, 22b an 23b are conventionally set to the same value. That is, a ratio of transistor size of the transistors constituting inverters 21b, 22b and 23b is fixed, so that the threshold voltage values are accordingly fixed.

Therefore, these inverters 21b, 22b and 23b are manufactured to have a fixed threshold voltage. The threshold voltage of the manufactured inverters 21b, 22b and 23b might however fluctuate because of some problem in a manufacturing process of the DRAM. In particular, the threshold voltage $V_{TRAS}'$ of inverter 21b in $\overline{RAS}$ input circuit 100b set to be smaller than the other threshold voltages $V_{TCAS}'$ and $V_{TWE}'$ causes such problems as follows.

Figure 5A:
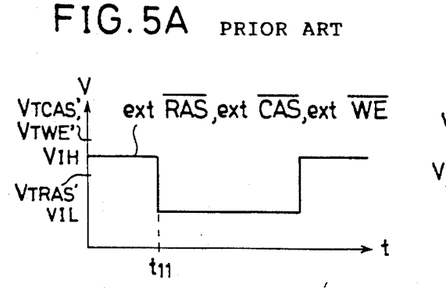
FIGS. 5A to 5D are timing charts explaining the problems caused in conventional input circuits.

FIGS. 5A to 5D are timing charts explaining the problems caused in the conventional input circuits 100b, 200b and 300b. With reference to FIG. 5A, it is assumed that the external $\overline{RAS}$ signal, the external $\overline{CAS}$ signal and the external $\overline{WE}$ signal have a voltage $V_{IH}$ as a H level and a voltage $V_{IL}$ as a L level. It is additionally assumed that the threshold voltage $V_{TRAS}'$ for the external $\overline{RAS}$ signal is lower than the threshold voltages $V_{TCAS}'$ and $V_{TWE}'$ for the external $\overline{CAS}$ signal and the external $\overline{WE}$ signal. It is further assumed that the voltage $V_{IH}$ is lower than the threshold voltages $V_{TCAS}'$ and $V_{TWE}'$ and higher than the threshold voltage $V_{TRAS}'$.

Figure 5B:
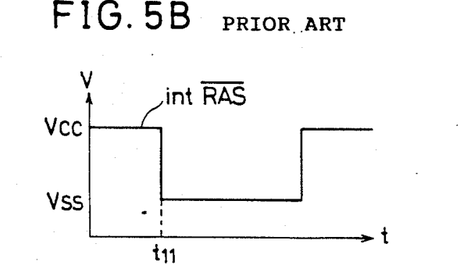
Figure 5C:
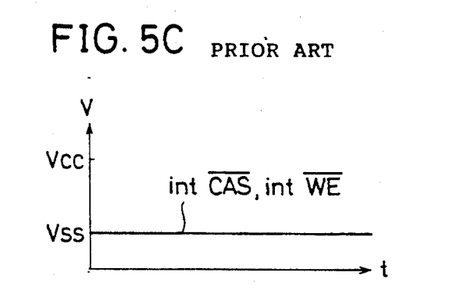
Figure 5D:
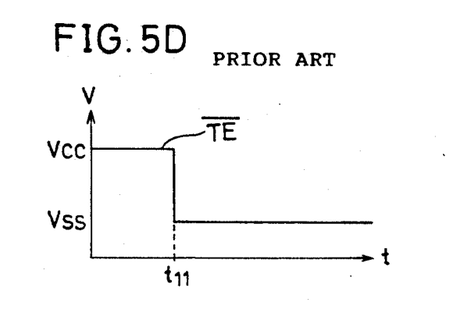

The internal $\overline{RAS}$ signal generated in response to the external $\overline{RAS}$ signal is at a H level until the time t11 as shown in FIG. 5B. The external $\overline{RAS}$ signal falls at the time t11, whereby the internal $\overline{RAS}$ signal falls accordingly. On the other hand, the internal $\overline{CAS}$ signal and the internal $\overline{WE}$ signal are maintained at a L level as shown in FIG. 5C. As a result, the test signal $\overline{TE}$ falls at the time t11 as shown in FIG. 5D, to cause the same situation as shown in FIG. 2. In other words, the test mode is started even though the start of the test mode is not externally required. In other words, the operation in the test mode is started although the operation in an ordinary reading or writing mode is required. This causes inconvenience in a test (a test at a factory) before a shipment of DRAMs as will be described later.

Figure 6:
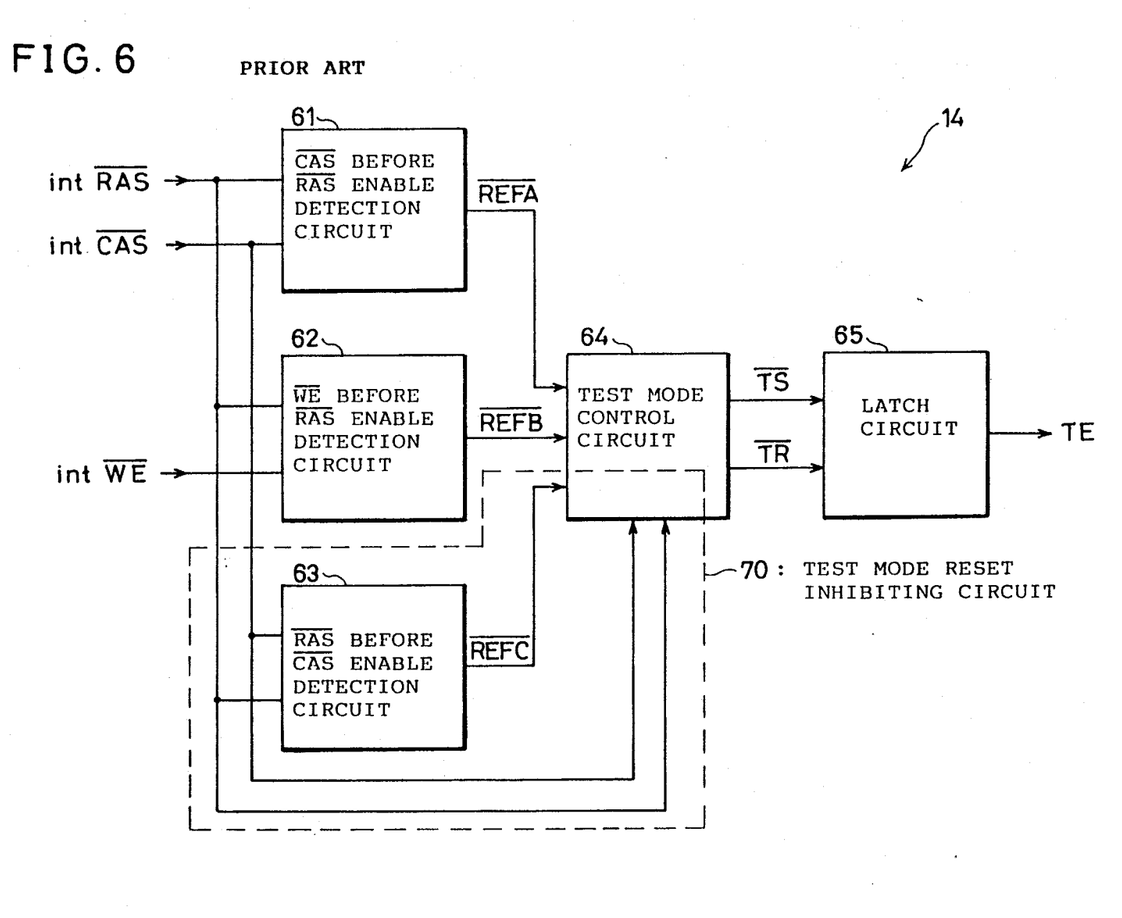
FIG. 6 is a block diagram of the test mode controller shown in FIG. 1.

FIG. 6 is a block diagram of test mode controller 14 shown in FIG. 1. With reference to FIG. 6, test mode controller 14 comprises a $\overline{CAS}$ before $\overline{RAS}$ enable detection circuit 61 for detecting a fall of the internal $\overline{CAS}$ signal before a fall of the internal $\overline{RAS}$ signal, a $\overline{WE}$ before $\overline{RAS}$ enable detection circuit 62 for detecting a fall of the internal $\overline{WE}$ signal before a fall of the internal $\overline{RAS}$ signal and an $\overline{RAS}$ before $\overline{CAS}$ enable detection circuit 63 for detecting a fall of the internal $\overline{RAS}$ signal before a fall of the internal $\overline{CAS}$ signal. Upon a detection of a predetermined condition, the detection circuits 61, 62 and 63 cause detection signals $\overline{REFA}$, $\overline{REFB}$ and $\overline{REFC}$ to fall, respectively. That is, when the designation of the start of the test mode is detected, detection circuits 61 and 62 output L level signals $\overline{REFA}$ and $\overline{REFB}$, respectively. A test mode control circuit 64 applies the test starting pulse $\overline{TS}$ to a latch circuit 65 in response to the signals $\overline{REFA}$ and $\overline{REFB}$. Latch circuit 65 generates the L level test signal $\overline{TE}$ by holding the pulse $\overline{TS}$.

Conversely, the detection of the designation of the end of the test mode causes only the output signal $\overline{REFA}$ of detection circuit 61 to fall. Test mode control circuit 64 applies the test ending pulse $\overline{TR}$ to latch circuit 65 in response to the signal $\overline{REFA}$. Latch circuit 65 causes the test signal $\overline{TE}$ to rise in response to the pulse $\overline{TR}$. In addition, the designation of the $\overline{RAS}$ only refresh mode causes only the output signal $\overline{REFC}$ of detection circuit 63 to fall. Test mode control circuit 64 outputs the test ending pulse $\overline{TR}$ in response to the signal $\overline{REFC}$, thereby causing the test signal $\overline{TE}$ to rise. $\overline{RAS}$ before $\overline{CAS}$ enable detection circuit 63 and a part of test mode control circuit 64 constitute a test mode reset inhibiting circuit 70.

Figure 7:
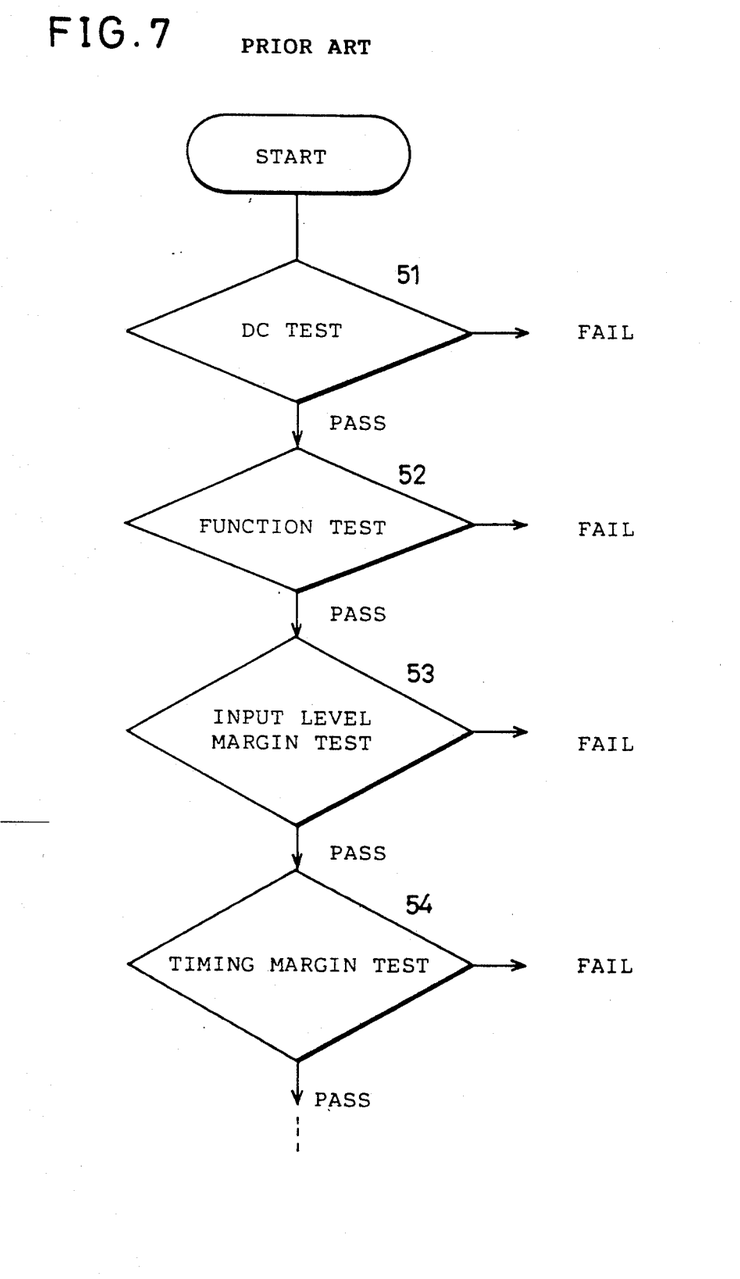
FIG. 7 is a flow chart of the tests of a DRAM before shipment.

FIG. 7 is a flow chart showing the order of the tests of a DRAM before the shipment. With reference to FIG. 7, first, a DC test is executed in step 51, wherein the DRAMs operate in an ordinary operation mode and the consumed current is measured. Then in step 52, a function test is executed. In the function test, it is examined whether the DRAMs perform a desired operation or not in several ordinary operation modes. In step 53, an input level margin test is executed. In the input level margin test, a range of a voltage level allowing a normal operation is measured by varying H or L voltage levels of externally applied input signal and control signals. In step 54, a timing margin test is executed. In the timing margin test, the limit is measured to which the DRAMs are not able to perform a desired operation in response to an externally applied control signal by varying a change timing of the control signal.

In the test steps 51 to 54 shown in FIG. 7, the examination is made as to whether the DRAMs meet a required standard or use and DRAMs which do not meet these requirements are considered to be defective (fail). Conversely, only the DRAMs meeting all these requirements are considered non-detective and shipped accordingly (pass). It is to be noted that in all the tests 51 to 54 shown in FIG. 7, the DRAMs should be operated in an ordinary operation mode at any time.

As the foregoing, the tests before shipment should be carried out under an ordinary operation mode according to the test sequence shown in FIG. 7. Thus, the change of an operation mode of the DRAMs from an ordinary mode to a test mode without an external request should be avoided. If the DRAMs are brought into an undesired test mode during the test sequence shown in FIG. 7, the test result shows a fail even though none of the DRAMs is defective. This means that a normal testing is prevented. Therefore, it is necessary to prevent such situations shown in FIGS. 5A to 5D from occurring during the tests before the shipment.

SUMMARY OF THE INVENTION

One object of the present invention is to prevent a semiconductor memory from entering an undesired operation modes, operation modes of which memory can be controlled by a combination of two externally applied control signals.

Another object of the present invention is to prevent an operation mode of a DRAM from shifting to an undesired test mode, which DRAM is capable of entering the test mode by a combination of an external $\overline{RAS}$ signal and an external $\overline{CAS}$ signal.

Briefly stated, the semiconductor memory according to the present invention operates under operation modes designated by externally applied first and second state control signals. The first and the second state control signals take first and second logics according to their potentials, respectively. The semiconductor memory includes a first determination circuitry for determining a logic of the first state control signal, a second determination circuitry for determining a logic of the second state control signal and an operation mode detecting circuitry for detecting a designation of a predetermined operation mode in response to the first and the second determination circuitry. When the first determination circuitry makes a determination of the first logic of the first condition control signal and the logic of the second determination circuitry makes a determination that the logic of the second state control signal changes from the second logic to the first logic, the operation mode detecting circuitry detects the designation of the predetermined operation mode. In this semiconductor memory, the control of the threshold levels of the first and the second determination circuitry facilitates the determination of the first logic of the second state control signal more than the determination of the first logic of the first state control signal. As a result, the operation mode detecting circuitry is difficult to designate a predetermined operation mode, thereby preventing the semiconductor memory to undesirably enter a predetermined operation.

According to another aspect, the DRAM according to the present invention operates under a test mode designated by a combination of an external $\overline{RAS}$ signal and an external $\overline{CAS}$ signal. The DRAM includes an $\overline{RAS}$ input circuitry for generating an internal $\overline{RAS}$ signal determined by a first predetermined threshold voltage in response to an external $\overline{RAS}$ signal, a $\overline{CAS}$ input circuitry for generating an internal $\overline{CAS}$ signal determined by a second predetermined threshold voltage in response to an external $\overline{CAS}$ signal and a test mode detecting circuitry for detecting a designation of the test mode in response to the internal $\overline{RAS}$ signal changing from a H level to a L level while the internal $\overline{CAS}$ is at a L level. The DRAM starts operating under the test mode in response to the test mode detecting circuitry. In this DRAM, the threshold voltage of the $\overline{RAS}$ input circuitry is set to be higher than that of the $\overline{CAS}$ input circuitry.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 8:
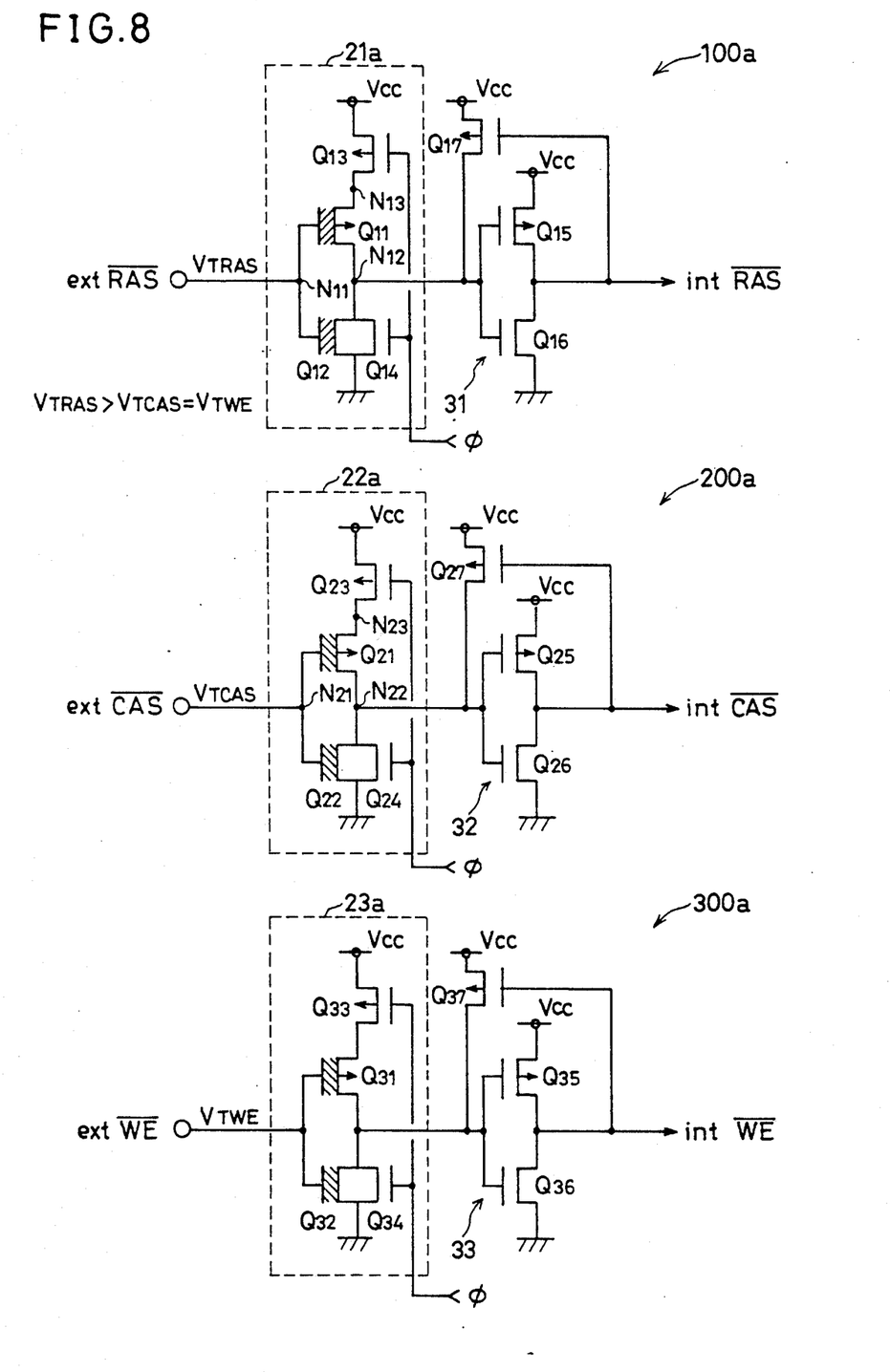
FIG. 8 is a circuit diagram of an $\overline{RAS}$ input circuit, a $\overline{CAS}$ input circuit and a $\overline{WE}$ input circuit according to one embodiment of the present invention.

With reference to FIG. 8, an $\overline{RAS}$ input circuit 100a includes an inverter 21a having a threshold voltage $V_{TRAS}$. A $\overline{CAS}$ input circuit 200a includes an inverter 22a having a threshold voltage $V_{TCAS}$. A $\overline{WE}$ input circuit 300a includes an inverter 23a having a threshold voltage $V_{TWE}$. Each value of the threshold voltages $V_{TRAS}$, $V_{TCAS}$ and $V_{TWE}$ is settled to satisfy the following expression.

$$V_{TRAS} > V_{TCAS} = V_{TWE} \qquad (1)$$

The threshold voltage $V_{TRAS}$ of inverter 21a is controlled by controlling, for example, a channel width ratio of a PMOS transistor Q11 to an NMOS transistor Q12. Similarly, the threshold voltage $V_{TCAS}$ is controlled by controlling a channel width ratio of a PMOS transistor Q21 to an NMOS transistor Q22.

Figure 10:
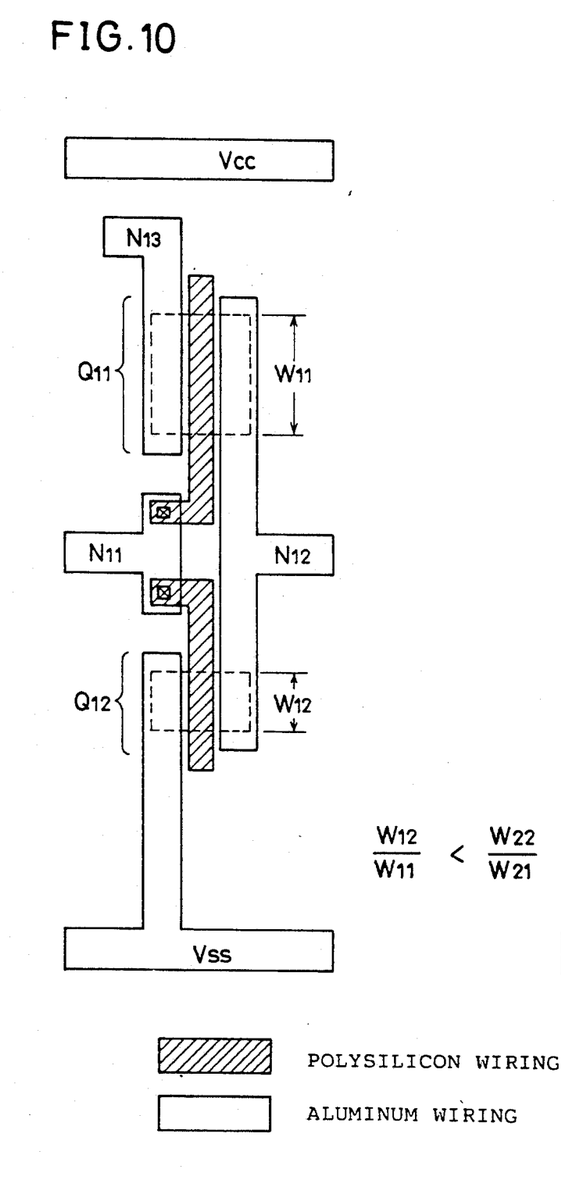
FIG. 10 is a diagram showing a layout of the inverter constituting the $\overline{RAS}$ input circuit shown in FIG. 8.

FIG. 10 shows PMOS transistor Q11 and NMOS transistor Q12 constituting inverter 21a. Transistor Q11 has a channel width W11. Transistor Q12 has a channel width W12 smaller than W11. Reference signs N11, N12 and N13 shown in FIG. 10 correspond to the positions of nodes N11, N12 and N13 shown in FIG. 8, respectively.

Figure 11:
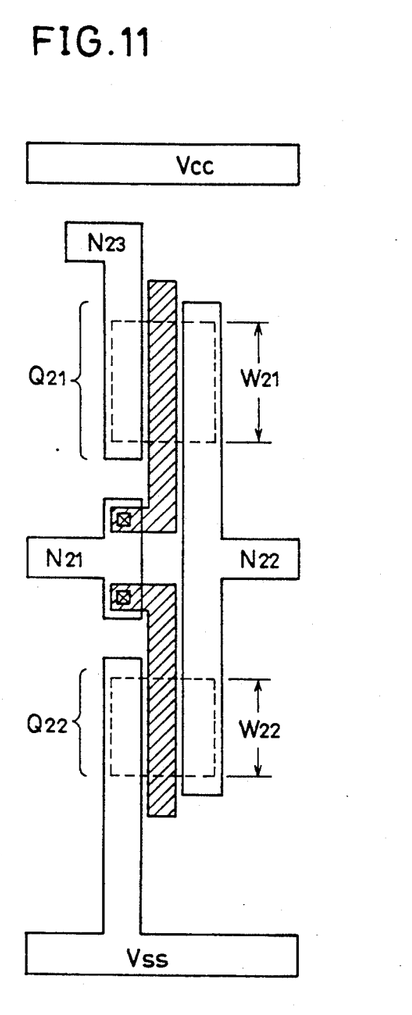
FIG. 11 is a diagram showing a layout of the inverter constituting the $\overline{CAS}$ input circuit shown in FIG. 8.

FIG. 11 shows PMOS transistor Q21 and NMOS transistor Q22 constituting inverter 22a. Transistor Q21 has a channel width W21. Transistor Q22 has a channel width W22. Reference signs N21, N22 and N23 also correspond to the positions of the nodes shown in FIG. 8, respectively.

In order to satisfy the above-described relation (1), channel widths W11, W12, W21 and W22 of transistors Q11, Q12, Q21 and Q22 are settled to satisfy the following relation.

$$W12/W11 < W22/W21 \qquad (2)$$

The following advantages can be obtained by settling the threshold voltages of $\overline{RAS}$ input circuit 100a, $\overline{CAS}$ input circuit 200a and $\overline{WE}$ input circuit 300a to satisfy the relation of the expression (1).

Figure 9A:
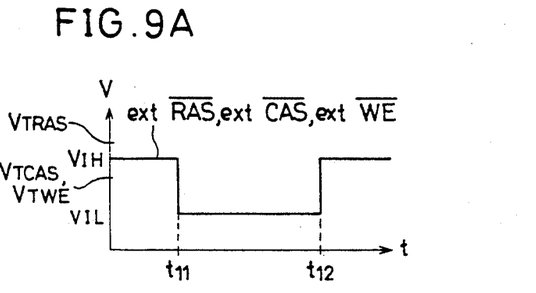
FIGS. 9A to 9D are timing charts explaining operations of the input circuits shown in FIG. 8.
Figure 9B:
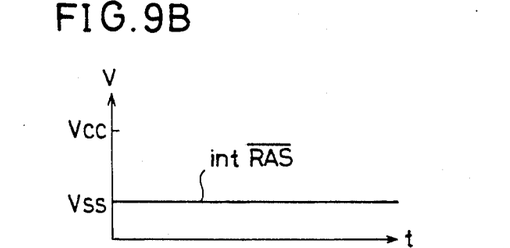
Figure 9C:
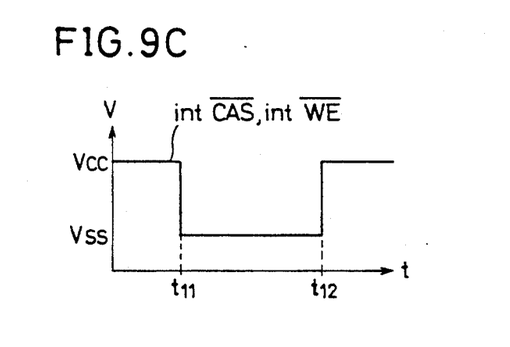
Figure 9D:
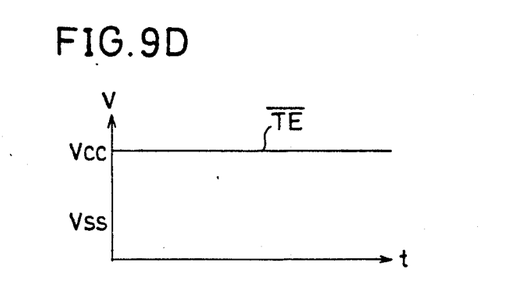

With reference to FIG. 9A, it is assumed that H levels of the external $\overline{RAS}$ signal, the external $\overline{CAS}$ signal and the external $\overline{WE}$ signal are lower than the voltage level of the threshold voltage $V_{TRAS}$ and higher than the threshold voltages $V_{TCAS}$ and $V_{TWE}$. It is additionally assumed that the external $\overline{RAS}$ signal, the external $\overline{CAS}$ signal and the external $\overline{WE}$ signal fall at the time t11 and rise at the time t12. Since in $\overline{RAS}$ input circuit 100a shown in FIG. 8, the threshold voltage $V_{TRAS}$ is set to a level higher than the voltage value $V_{IH}$ which is a H level of the external $\overline{RAS}$ signal, the internal $\overline{RAS}$ signal is held at a L level as shown in FIG. 9B. At the same time, since the threshold voltage $V_{TCAS}$ and $V_{TWE}$ are set to be smaller than the voltage value $V_{IH}$, the internal $\overline{CAS}$ signal and the internal $\overline{WE}$ signal change in response to the external $\overline{CAS}$ signal and the external $\overline{WE}$ signal as shown in FIG. 9C. With the internal $\overline{RAS}$ signal maintained at a L level, the test signal $\overline{TE}$ generated from test mode controller 14 remains high, thereby preventing the DRAM to which input circuits 100a, 200a and 300a shown in FIG. 8 are applied, from undesirably entering to a test mode operation.

Setting the threshold voltage $V_{TRAS}$ for the external $\overline{RAS}$ signal to be higher than the threshold voltages $V_{TCAS}$ and $V_{TWE}$ results in a determination of a L level of the external $\overline{RAS}$ made easier than a determination of a L level of the external $\overline{CAS}$ signal. Therefore, the internal $\overline{RAS}$ signal more easily changes to a L level as compared with the internal $\overline{CAS}$ signal and the internal $\overline{WE}$ signal. As a result, such a change as shown in FIG. 2 is hardly caused that the internal $\overline{RAS}$ signal falls after the internal $\overline{CAS}$ and the internal $\overline{WE}$ signal shift to a L level. It is therefore possible to prevent the DRAM from operating under a test mode without a request for a start of a test mode operation.

In a test of the DRAM having input circuits 100a, 200a and 300a shown in FIG. 8 excuted according to the test sequence shown in FIG. 7, an operation mode of the DRAM is hardly shifted from an ordinary operation mode to a test mode by mistake. In other words, the DRAM is allowed to continue its operation easily under an ordinary operation mode. As a result, the DRAM operates under an ordinary operation mode during the test shown in FIG. 7, so that a right test result can be obtained without executing a test over again.

While in the embodiment shown in FIG. 8, the threshold voltage is controlled by controlling channel widths of the transistors constituting inverters 21a, 22a and 23a of the respective input circuits 100a, 200a and 300a, the control of the threshold voltage is not limited thereto and it is to be noted that the same can be obtained by controlling a gate length of these transistors or a diffusion concentration of the transistors, for example. It is further pointed out that the control of the channel width of transistor Q13 in $\overline{RAS}$ input circuit 100a, for example, is effective for controlling the threshold voltage. That is, it is effective to set a ratio of the channel width W13 of transistor Q13 to that of transistor Q11, i.e. W13/W11, smaller than a ratio in inverter 22a of $\overline{CAS}$ input circuit 200a. In other words, the threshold voltage $V_{TRAS}$ can be controlled by controlling a channel width of at least one transistor among transistors Q11 to Q13 constituting inverter 21a.

While in the embodiment shown in FIG. 8, the threshold voltages are settled to satisfy the expression (1), it is to be noted that the threshold voltage $V_{TWE}$ for the external $\overline{WE}$ signal is arbitrary. That is, at least the threshold voltages $V_{TRAS}$ and $V_{TCAS}$ should satisfy the expression (1).

It is to be noted that while CMOS inverters 21a, 22a and 23a are applied to the embodiment shown in FIG. 8, NMOS inverters can be used in place of the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory operable under a predetermined operation mode designated by a combination of externally applied first and second state control signals ($\overline{CAS}$, $\overline{RAS}$), said first and second state control signals taking first and second logics (L, H), respectively, according to their potentials, said semiconductor memory comprising:
    first determining means (22a) connected to receive the first state control signal for determining a logic of the first state control signal;
    second determining means (21a) connected to receive the second state control signal for determining a logic of the second state control signal;
    operation mode detecting means (14) responsive to said first and second determining means for detecting the designation of said predetermined operation mode;
    said operation mode detecting means detecting said first determining means determining the first logic of the first state control signal and said second determining means determining a change of the second state control signal from the second logic to the first logic,
    said semiconductor memory starting its operation under said predetermined operation mode in response to said operation mode detecting means, and
    facilitating means (W11, W12, W21, W22) for facilitating the determination of the first logic of the second state control signal more than the determination of the first logic of the first state control signal by controlling the threshold levels of said first and second determining means.

2. The semiconductor memory according to claim 1, wherein
    said first determining means includes first inverter means (22a) connected to receive said first state control signal,
    said second determining means includes second inverter means (21a) connected to receive said second state control signal,
    said facilitating means includes threshold voltage controlling means (W11, W12, W21, W22) for controlling the threshold voltages of said first and second inverter means.

3. The semiconductor memory according to claim 2, wherein
    said first inverter means includes a first field effect transistor (Q21) of a conductive type and a second field effect transistor (Q22) of the opposite conductive type connected in series between first and second power supply potentials,
    said second inverter means includes a third field effect transistor (Q11) of a conductive type and a fourth field effect transistor (Q12) of the opposite conductive type connected in series between the first and the second power supply potentials,
    said threshold voltage controlling means includes means (W11, W12, W21, W22) for controlling channel widths of said first to fourth field effect transistors.

4. The semiconductor memory according to claim 1, wherein
    said predetermined operation mode includes a test mode for testing said semiconductor memory, said operation mode detecting means includes test mode controller means (14) responsive to said first and second determining means for causing said semiconductor memory to operate under the test mode.

5. The semiconductor memory according to claim 1, wherein
said first state control signal includes a column address strobe signal ($\overline{CAS}$),
said second state control signal includes a row address strobe signal ($\overline{RAS}$),
said first logic is defined by a L level,
said second logic is defined by a H level.

6. The semiconductor memory according to claim 1, wherein said semiconductor memory includes a dynamic random access memory (DRAM).

7. A dynamic random access memory (DRAM) operable under a predetermined test mode designated by a combination of externally applied external $\overline{RAS}$ signal and external $\overline{CAS}$ signal, comprising, an $\overline{RAS}$ input circuit (100a) for receiving the external $\overline{RAS}$ signal to generate an internal $\overline{RAS}$ signal determined by a first predetermined threshold voltage;
a $\overline{CAS}$ input circuit (200a) for receiving the external $\overline{CAS}$ signal to generate an internal $\overline{CAS}$ signal determined by a second predetermined threshold voltage;
a test mode detecting circuit (14) for detecting a designation of the test mode in response to the internal $\overline{RAS}$ signal changing from a H level to a L level while the internal $\overline{CAS}$ signal is at a L level;
said semiconductor memory starting its operation under the test mode in response to said test mode detecting circuit, and
means (W11, W12, W21, W22) for setting the threshold voltage of said $\overline{RAS}$ input circuit to a level higher than the threshold voltage of said $\overline{CAS}$ input circuit.

* * * * *